US011334704B1

(12) United States Patent
Zhang et al.

(10) Patent No.: US 11,334,704 B1
(45) Date of Patent: May 17, 2022

(54) SYSTEM, METHOD, AND COMPUTER PROGRAM PRODUCT FOR MIXED SIGNAL VERIFICATION

(71) Applicant: Cadence Design Systems, Inc., San José, CA (US)

(72) Inventors: Nan Zhang, Andover, MA (US); Chandrashekar L. Chetput, San Jose, CA (US); Aaron Mitchell Spratt, Uxbridge, MA (US); Joseph Leo Zielke, Jr., Doylestown, PA (US); Rajat Kanti Mitra, Bedford, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/060,263

(22) Filed: Oct. 1, 2020

(51) Int. Cl.
*G06F 30/398* (2020.01)
*G06F 30/3308* (2020.01)
*G06F 30/367* (2020.01)
*G06F 30/38* (2020.01)

(52) U.S. Cl.
CPC ........ *G06F 30/398* (2020.01); *G06F 30/3308* (2020.01); *G06F 30/367* (2020.01); *G06F 30/38* (2020.01)

(58) Field of Classification Search
CPC .. G06F 30/398; G06F 30/3308; G06F 30/367; G06F 30/38
USPC ................... 716/111, 104, 106, 136; 703/16
See application file for complete search history.

(56) References Cited

U.S. PATENT DOCUMENTS

| 9,501,592 | B1* | 11/2016 | Kolpekwar | G06F 30/367 |
|---|---|---|---|---|
| 9,646,118 | B1* | 5/2017 | Klair | G06F 30/20 |
| 10,380,294 | B1 | 8/2019 | Spratt et al. | |
| 10,671,785 | B1* | 6/2020 | Mihalache | G06F 30/367 |
| 10,769,336 | B1* | 9/2020 | Zhang | G06F 30/36 |
| 10,816,600 | B1* | 10/2020 | Liddell | G01R 31/2846 |
| 11,218,438 | B2* | 1/2022 | Dao | H04L 61/1511 |
| 2011/0153305 | A1* | 6/2011 | Chang | G06F 30/33 703/17 |
| 2011/0184713 | A1* | 7/2011 | Yang | G06F 30/33 703/13 |
| 2012/0180011 | A1* | 7/2012 | Gupta | G06F 30/327 716/103 |
| 2013/0179142 | A1* | 7/2013 | Kim | G06F 30/33 703/14 |
| 2014/0331195 | A1* | 11/2014 | Agarwala | G06F 30/33 716/104 |

(Continued)

OTHER PUBLICATIONS

Mantis 3398, "SV-DC User Defined Nets and Resolution Functions", http://www.eda-twiki.org/twiki/pub/VerilogAMS/AmsDiscussionDoc/UserNettypes_v3.pdf, Apr. 6, 2011, 10 pages. (Year: 2011).*

(Continued)

*Primary Examiner* — Phallaka Kik
(74) *Attorney, Agent, or Firm* — Mark H. Whittenberger, Esq.; Holland & Knight LLP (57) ABSTRACT

The present disclosure relates to a computer-implemented method for mixed signal design verification. Embodiments may include receiving, using a processor, an electronic circuit design and compiling and elaborating the electronic circuit design. Embodiments may also include simulating the electronic circuit design and updating, during the simulating, a System Verilog User-Defined Resolution function ("SV-UDR") associated with the electronic circuit design.

17 Claims, 10 Drawing Sheets

(56) References Cited

U.S. PATENT DOCUMENTS

2016/0232084 A1* 8/2016 Bhat .................. G06F 11/3664
2018/0225394 A1* 8/2018 Verma ..................... G06F 30/33
2019/0332732 A1* 10/2019 Kintali ................... H03M 7/24

OTHER PUBLICATIONS

Balasubramanian et al., "Solutions for Mixed-Signal SoC Verification Using Real Number Models", Cadence Design System, Inc., 2013, 11 pages. (Year: 2013).*
Patel, "FPGA Designs With Verilog and SystemVerilog", Oct. 2017, 183 poages. (Year: 2017).*
Shera et al., "Buck Converter Modeling in System Verilog for Verification and Virtual Test Applications", IEEE, 2015, 6 pages. (Year: 2015).*
Stiles, ("Real Number Modeling in SystemVerilog for Analog Modules: Handling the Connectivity", XtremeEDA, https://www.linkedin.com/pulse/real-number-modeling-systemverilog-analog-modules-handling-stiles?form=MY01SV&OCID=MY01SV, published Sep. 8, 2015, 6 pages). (Year: 2015).*

* cited by examiner

Example of TCL command:

```
# TCL command:

# Set UDR on a specific net
> dms -set_udr <net name> <UDR name>

# Reset UDN to use UDR from SV declaration on specific net
> dms -reset_udr <net name>
```

Example of VPI task:

```
// VPI task:

module testbench;
    initial begin
        // Set UDR on specific net
        #100 $cds_set_udr ("<net name>", "<UDR name>");
        // Reset UDR on specific net
        #100 $cds_reset_udr ("<net name>", "");
    end
endmodule
```

```
// UDN definition:

//////////////////////////////
package myEE_pkg;
//////////////////////////////
// Struct to define Voltage, current, and resistance for the electrical nettype:
typedef struct {
   real V;
   real I;
   real R;
} EEstruct;

function automatic EEstruct res_EE (input EEstruct drivers[]);
   real IT=0, GT=0;   // summed current & conductance for node
   real Vsrc=`Z;      // value of driving voltage source begin
   res_EE.V=IT/GT;    // normal unsaturated result
   res_EE.I=0;
   res_EE.R=1/GT;     // normal on resistance
end endfunction nettype EEstruct EEnet with res_EE;

endpackage

//////////////////////////////
package myEE_pkg_dbg;
//////////////////////////////

(* CDS_DYNAMIC_UDN = "EEnet" *)
function automatic EEstruct res_EE_Vfrc (input EEstruct drivers[]);
   real IT=0, GT=0;   // summed current & conductance for node
   real Vsrc=`Z;      // value of driving voltage source begin
   $cds_get_value("testbench.vVal", Vsrc);
   res_EE_Vfrc.V=Vsrc;   // normal unsaturated result
   res_EE_Vfrc.I=0;
   res_EE_Vfrc.R=1/GT;   // normal on resistance
end endfunction
```

UDT definition:
```
# UDN package for design
    package rnm_pkg;
    typedef struct {
      real rval;
    } T;

function automatic T Tsum (input T driver[]);
    ...
    endfunction nettype T mywreal with Tsum;
    endpackage

UDN package for performance
    package rnm_pkg_perf1;
    (* CDS_DYNAMIC_UDN = "rnm_pkg::mywreal" *)
    function automatic T Tmax (input T driver[]);
    ...
    endfunction
    endpackage

UDN package for performance
    package rnm_pkg_perf2;
    (* CDS_DYNAMIC_UDN = "rnm_pkg::mywreal" *)
    function automatic T Tmin (input T driver[]);
    ...
    endfunction
    (* CDS_DYNAMIC_UDN = "rnm_pkg::mywreal" *)
    function automatic T Tavg (input T driver[]);
    ...
    endfunction
    endpackage
```

Design:
```
import rnm_pkg::*;
module top();
  interconnect a;
  foo dut(a);
endmodule module foo(a);
  output a;
  mywreal a;
  real ra=1.0;
  real rb=1.8;

always #10 rb=1.8-rb;

assign a = '{ra};
  assign a = '{rb};

endmodule
```

UDT definition:
  # UDN package for design
    package rnm_pkg;
    typedef struct {
      real rval;
    } T;

function automatic T Tsum (input T driver[]);
    ...
    endfunction     nettype T mywreal with Tsum;
    endpackage   # UDN package for performance
    package rnm_pkg_perf1;
    function automatic T Tmax (input T driver[]);
    endfunction     endpackage   # UDN package for performance
    package rnm_pkg_perf2;

function automatic T Tmin (input T driver[]);
    endfunction     function automatic T Tavg (input T driver[]);
    endfunction     endpackage

Design:
  import rnm_pkg::*;
  module top();
    interconnect a;
    foo dut(a);
  endmodule   module foo(a);
    output a;
    mywreal a;
    real ra=1.0;
    real rb=1.8;

always #10 rb=1.8-rb;

assign a = '{ra};
    assign a = '{rb};

endmodule

SYSTEM, METHOD, AND COMPUTER PROGRAM PRODUCT FOR MIXED SIGNAL VERIFICATION

FIELD OF THE INVENTION

The present disclosure relates to design simulation, and more specifically, to mixed signal verification techniques associated with an electronic design such as a SystemVerilog design.

DISCUSSION OF THE RELATED ART

Integrated circuits, or ICs, are created by patterning a substrate and materials deposited on the substrate. The substrate is typically a semiconductor wafer. The patterned features make up devices and interconnections. This process generally starts with a designer creating an integrated circuit by hierarchically defining functional components of the circuit using a hardware description language. From this high-level functional description, a physical circuit implementation dataset is created, which is usually in the form of a netlist. This netlist identifies logic cell instances from a cell library, and describes cell-to-cell connectivity.

Many phases of these electronic design activities may be performed with computer aided design (CAD) tools or electronic design automation (EDA) systems. For example, an integrated circuit designer may use a set of layout EDA application programs, such as a layout editor, to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters. The EDA layout editing tools are often performed interactively so that the designer can review and provide careful control over the details of the electronic design.

SystemVerilog "SV" (IEEE 1800 standard) is popular amongst design and verification community as a language of choice for describing the digital circuits. Recently, SystemVerilog is also extended to account for modeling for analog/mixed-signal circuits. These extensions allow users to model analog/mixed-signal behavior more accurately and support their evaluation by discrete event driven simulators. Specifically, these extensions allow creation and use of a SystemVerilog real signal that can support bi-directional communication. While such SystemVerilog real signal representations can be used to effectively model of analog mixed-signal behavior, these representations fall short in addressing issues in real life design applications.

The growing amount of analog circuitry on today's SoCs (System on Chip) further cements the growing understanding that isolated analog and digital verification may no longer be sufficient to reach tapeout. What is often needed is a chip-level functional verification that examines the functional interactions between analog and digital blocks. The challenges lie in how to implement such tasks, especially given that a SPICE/RTL (register-transfer level) co-simulation may be too slow. Verilog, for instance, has very limited real number modeling (RNM) support in that engineers may use real variables inside a model, but there are no real variable ports. VHDL (VHSIC Hardware Description Language or Very High Speed Integrated Circuit Hardware Description Language), on the other hand, supports real number ports, has custom or compound signals and ports that make it possible to pass both current and voltage, and offers custom resolution functions. The issue is that Verilog is nonetheless far more widely used for digital design than VHDL. Verilog-AMS (VAMS) is widely used for RNM. VAMS supports real number ports and variables, along with six resolution functions on wreal nets. VAMS also has an analog solver if higher accuracy is desired, along with a discrete solver that may be used for real value equations. SystemVerilog, meanwhile, is making strong inroads into digital design and verification. Far more than just another version of Verilog, SystemVerilog also includes extensive verification features and an assertion language.

For example, the SystemVerilog Real Number Mode (SV-RNM) provides a powerful alternative approach to model analog behavior. The user could define their own user-defined nettype in SystemVerilog (SV-UDN) to describe analog signal behavior from the digital designer's perspective and obtain better simulation speed with digital engine. However, in today's SystemVerilog language standard, only one user defined resolution function (SV-UDR) could be associated with SV-UDN. As a result, if users need to create multiple variations of the same resolution function, for example one as their default, another for debugging and a third with better performance, they have to create a separate SV-UDN with its associated SV-UDR for each of those representations. Alternatively, users have to maintain a library of those representations and recompile their design every time they want to change between those representations for the same design.

SUMMARY OF INVENTION

In one or more embodiments of the present disclosure, a computer-implemented method for mixed signal design verification is provided. The method may include receiving, using a processor, an electronic circuit design and compiling and elaborating the electronic circuit design. The method may also include simulating the electronic circuit design and updating, during the simulating, an SV-UDR associated with the electronic circuit design.

One or more of the following features may be included. In some embodiments, updating may be specified using a command and/or a task. The method may include defining a plurality of SV-UDRs in a distinct System Verilog package. Compiling may include compiling the plurality of SV-UDRs during the elaborating. The method may further include selecting one of the plurality of SV-UDRs at a first timepoint during the simulating and selecting a second of the plurality of SV-UDRs at a second timepoint during the simulating. In some embodiments, the electronic circuit design may be in at least one of a Simulation Program with Integrated Circuit Emphasis ("SPICE") language or a Verilog-AMS language. The command may be a tool command language ("TCL") command. The task may be a Verilog Procedural Interface ("VPI") task.

In one or more embodiments of the present disclosure, a system including a computing device having at least one processor configured to receive, compile, and elaborate an electronic circuit design is provided. The at least one processor may be further configured to simulate the electronic circuit design and update, during the simulation, a SV-UDR associated with the electronic circuit design, wherein the at least one processor is further configured to compile a plurality of SV-UDRs in a single elaboration.

One or more of the following features may be included. In some embodiments, the at least one processor may be further configured to select one of the plurality of SV-UDRs at a first timepoint during the simulating and to select a second of the plurality of SV-UDRs at a second timepoint during the simulating. The at least one processor may be further configured to access the plurality of SV-UDRs from a SystemVerilog package that is separate from the electronic circuit design. The at least one processor may be further configured to model analog behavior associated with the electronic circuit design using a SystemVerilog Real Number Mode (SV-RNM). The at least one processor may be further configured to specify the update using a command. The at least one processor may be further configured to specify the update using a task.

In one or more embodiments of the present disclosure a computer-readable storage medium having stored thereon instructions that when executed by a machine result in one or more operations is provided. Operations may include receiving, using a processor, an electronic circuit design and compiling and elaborating the electronic circuit design. Operations may further include simulating the electronic circuit design and updating, during the simulating, a SV-UDR associated with the electronic circuit design using at least one of a command or a task.

One or more of the following features may be included. In some embodiments, operations may include defining a plurality of SV-UDRs in a distinct SV package separate from the electronic circuit design. In some embodiments, compiling may include compiling the plurality of SV-UDRs during the elaborating. Operations may also include modeling analog behavior associated with the electronic circuit design using an SV-RNM. Operations may further include selecting one of the plurality of SV-UDRs at a first timepoint during the simulating and selecting a second of the plurality of SV-UDRs at a second timepoint during the simulating.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The drawings illustrate the design and utility of various embodiments of the invention. It should be noted that the figures are not drawn to scale and that elements of similar structures or functions may be represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Embodiments of the present disclosure may allow for a user to change a specific SV-UDN's resolution function on demand, at run-time. Accordingly, and as discussed in further detail hereinbelow, embodiments of the verification process provided herein may provide such a method/mechanism to enable setting of SV-UDR dynamically during simulation and thereby accomplishing the concept of a dynamic SV nettype, which enables improved, high performance, mixed-signal verification. Additional information regarding (SV-RNM) may be found in U.S. Pat. No. 10,380, 294, which is incorporated by reference herein in its entirety.

When using SystemVerilog Real Number Models for mixed signal verification, the SV-UDN allows users to describe more general abstract values for a wire, including its resolution function, to describe the analog signal behavior. In these existing systems, once compiled, the user cannot change the functionality of the resolution function during simulation. It leads to a number of challenges from a user's perspective, namely, they need to create a variety of user-defined nettypes (each with a different resolution function) to reflect various user needs for functionality, debugging and performance. Further, each time the user updates the nettype to be used in a design, they need to recompile/rebuild their simulation snapshot for simulation.

As the usage of real number modeling grows, the user wants the flexibility to be able to change their SV-UDR to a debug version of resolution function during simulation, for example, to obtain more debugging functionality from resolution processing on a particular signal. And, in some other cases, to balance the simulation speed and accuracy of design, the user may want to update an SV-UDR to a faster or more accurate version on some particular signal at special time frame. In other cases, the user may want to simulate the behavior of a partially driven net by forcing the other fields of that nettype to a specific value and allowing the resolution function to resolve only specific fields based on the drivers, all within a special resolution function. There are many possible variations where a fundamental need of the user to be able to update a resolution function on a specific net or set of nets, on demand, at run-time is required. Accordingly, embodiments included herein present a new mechanism to address such a user need, which is both intuitive as well as flexible from the user's perspective.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosures. Some hardware description languages may include, but are not limited to, Verilog, VHDL, and Verilog-AMS. Various other hardware description languages may also be used as well.

Figure 1:
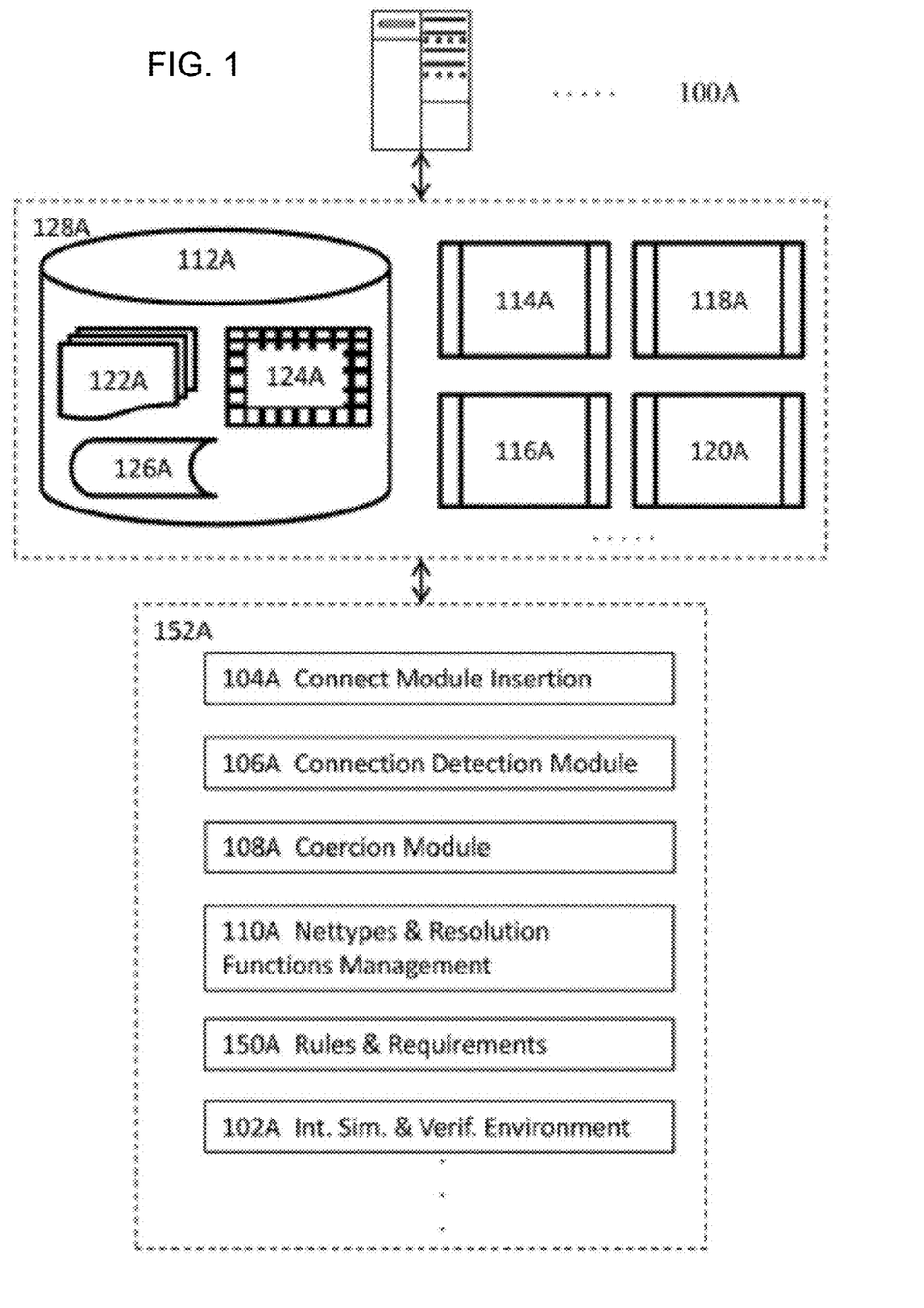
FIG. 1 illustrates a high level block diagram for a system for implementing analog behavioral modeling and IP (intellectual property) integration using SystemVerilog Hardware Description Language in accordance with the present disclosure.

FIG. 1 illustrates a high level block diagram for a system for implementing analog behavioral modeling and IP integration using SystemVerilog Hardware Description Language in some embodiments. In one or more embodiments, the system for implementing analog behavioral modeling and IP integration using SystemVerilog Hardware Description Language may comprise one or more computing systems 100A, such as a general purpose computer described in the System Architecture Overview section to implement one or more special proposes.

In some embodiments, the one or more computing systems 100A may invoke various system resources such as the processor(s) or processor core(s), memory, disks, etc. The one or more computing systems 100A may also initiate or interact with other computing systems to access various resources 128A that may comprise a global routing engine and/or a detail routing engine 114A, a layout editor 116A, a design rule checker 118A, a verification engine 120A, etc. The one or more computing systems 100A may further write to and read from a local or remote volatile or non-volatile computer accessible storage 112A that stores thereupon data or information such as, but not limited to, one or more data structures or databases (124A) (collectively database or databases hereinafter) such as various design databases including schematic design database(s) and physical design database(s). The local or remote volatile or non-volatile computer accessible storage 112A may further store thereupon libraries such as design rule decks, constraints, etc. (122A), or other information or data (126A) that may be used to facilitate the performance of various functions to achieve the intended purposes.

In some embodiments, the one or more computing systems 100A may, either directly or indirectly through various resources 128A to invoke various software, hardware modules or combinations thereof 152A that may comprises a connect module selection and insertion module 104A to select and insert one or more connect modules into electronic designs, a connection detection module 106A to detect incompatible connections (e.g., analog or electrical to digital or logic) in electronic designs, one or more database modules 108A to store, modify, extract, manage, or manipulate information or data from and to databases, a nettype and resolution function management module 110A to create, modify, or manage nettypes and resolution functions, a rules and requirement module 150A to store, modify, or manage various rules or requirements such as connection rules, etc., and an integrated simulation or verification environment 102A to perform various simulations or verification for electronic designs The integrated simulation or verification environment 102A may first compile the sources with appropriate compilers during the first time execution of the environment 102A, and subsequent executions require no elaboration and may run the simulations directly.

The integrated simulation or verification environment 102A may then elaborate the electronic design of interest. During the first time execution, the integrated simulation or verification environment 102A may build a temporary or persistent directory to store the intermediate objects and files needed to run the simulations or verification, and subsequent executions requires no elaboration of the same electronic design and run the simulations or verification directly with the intermediate objects and files in the temporary or persistent directory. The module 102A may further determine whether there is a change that requires re-compilation and re-elaboration based on these intermediate objects and files and iii. run the simulations or verification by utilizing various, integrated simulation tools or verification tools that recognize various source files of various formats, such as VHDL, e-language, SystemVerilog source files, etc. The module 102A may then store its simulation or verification output in a single file (e.g., "sim.log" or "verification.log"), in multiple files, or in one or more data structures such as one or more databases. One of the advantages of the integrated simulation or verification environment 102A is that the module 102A may simulate and/or verify the multi-language design and verification environments in a single step by simply specifying all input source files and options on a single command line or interactive input field in a user interface in some embodiments. Another advantage of the integrated simulation or verification environment 102A is that it supports all simulation languages, such as Verilog, VHDL, SystemVerilog, Verilog-AMS, VHDL AMS, and even files written in general programming languages such as C, C++, Java, etc.

Figure 2:
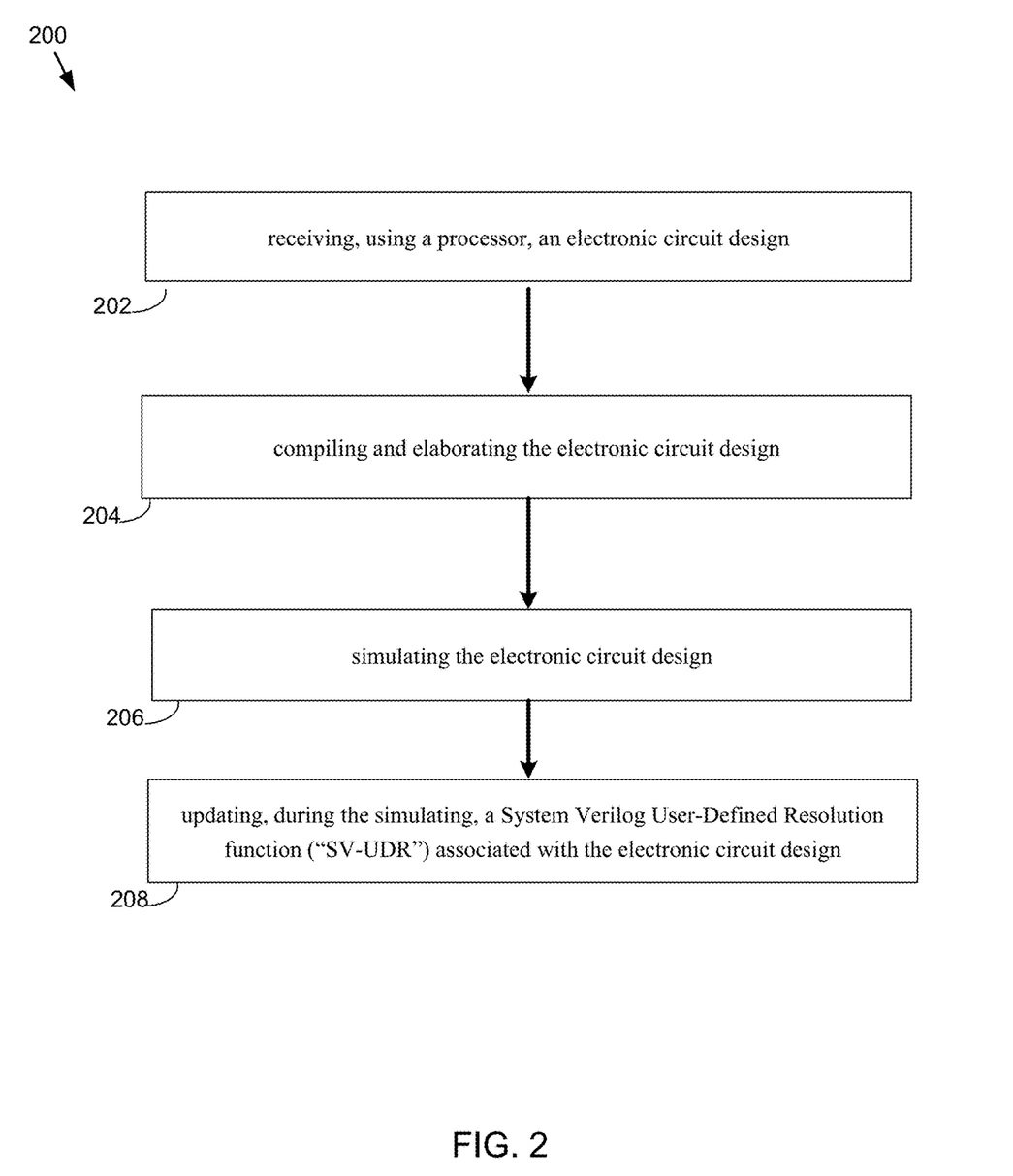
FIG. 2 is a flowchart depicting operations in accordance with an embodiment of the present disclosure.

Referring now to FIGS. 2-5 embodiments consistent with the verification process described herein are provided. FIG. 2 depicts a flowchart 200 depicting operations consistent with embodiments of the verification process described herein is provided. The method may include receiving (202), using a processor, an electronic circuit design and compiling and elaborating (204) the electronic circuit design. The method may also include simulating (206) the electronic circuit design and updating (208), during the simulating, an SV-UDR associated with the electronic circuit design. Numerous other operations are also within the scope of the present disclosure.

In today's SystemVerilog language standard, there is no mechanism for the user to specify multiple SV-UDRs to be associated with a specific SV-UDN. To overcome this limitation, embodiments of the present disclosure may define a new attribute, referred to herein as "CDS_DYNAMIC_UDN" which may be tagged to an SV-UDR in order to annotate all the SV-UDRs that may be applied to a specific SV-UDN. This may be in addition to the SV-UDR that is already associated to that SV-UDN using the SV standard's nettype declaration.

Figure 3:
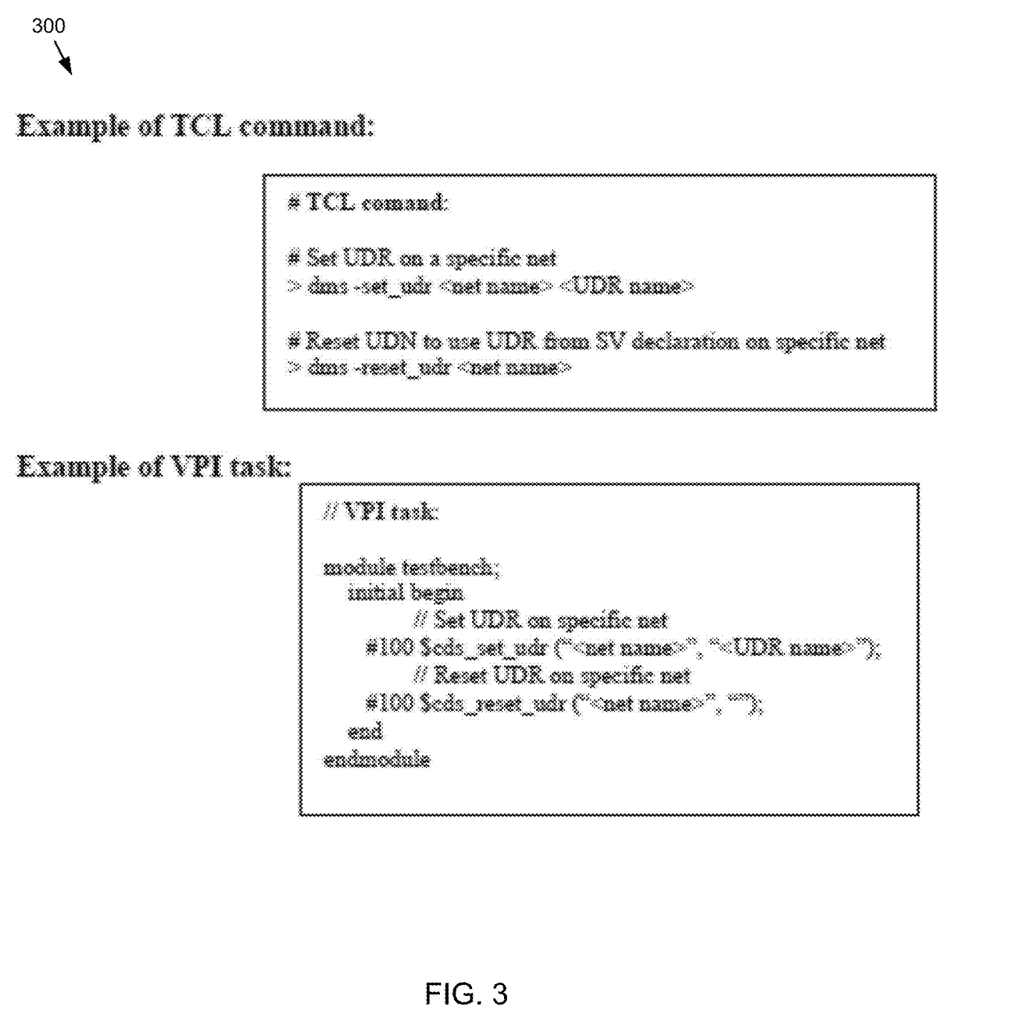
FIG. 3 is an example showing an example of a command and a task in accordance with an embodiment the present disclosure.

Referring again to FIGS. 3-4, additional embodiments consistent with the present disclosure are provided. FIG. 3 depicts some examples of possible commands and tasks that may be used to enable updates of SV-UDRs dynamically/on demand at run-time. During simulation, by default, only the SV-UDR which is associated with the SV-UDN declaration will be processed to resolve the specific net's values. The additional SV-UDRs for that SV-UDN will not be processed during simulation until user explicitly associates one of those specific UDRs with the corresponding UDN instance.

As an example, the user could use a TCL command or VPI task to specify such an updating of SV-UDR at run-time, for a specific instance of a UDN. Other commands using one or more third party interfaces (e.g., Python, SQL, Virtuoso SKILL, etc.) or HDL-based on-demand mechanisms (e.g., Verilog/SV Verilog Procedural Interface (VPI/DPI), etc.) are also within the scope of the present disclosure. Once the command to set the UDR for a specific SV-UDN net is encountered by the simulator, it may pick up the specified SV-UDR from the database and associate that SV-UDR with the specified net. In some embodiments, the simulator tool may process this new SV-UDR in order to resolve a value on the specified net after that. In this way, all of the other nets with the same SV-UDN may continue to use their existing SV-UDR associated with that nettype during build-time. As such, the user may be able to perform required changes on a specific instance of an SV-UDN in the design, without impacting any other instances of the same SV-UDN as well.

Such an update of SV-UDR may occur dynamically, without requiring any recompilation/rebuild of the design, therefore creating a dynamic SV nettype.

Referring again to FIG. 4, a flowchart 400 is provided depicting operations consistent with the present disclosure. Flowchart 400 indicates that some or all of the aspects of the verification process herein may occur during build-time and run-time. In some embodiments, the process may defer the computation shown at build-time in flowchart 400 to run-time as well.

Figure 4:
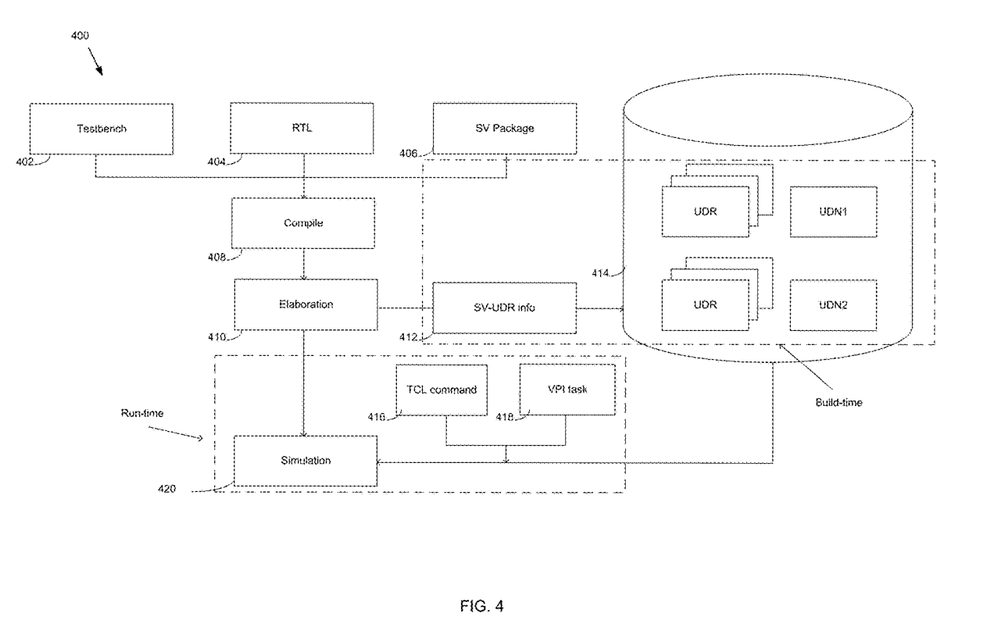
FIG. 4 is a diagram showing an example consistent with an embodiment of the present disclosure.

In FIG. 4, testbench 402 may include the HDL code to generate a test stimulus and to verify the test results. The RTL 404 may include the design source code that describes the design behavior. This may be in any suitable format, including, but not limited to, Verilog, SystemVerilog, VHDL, Verilog-AMS, SPICE, etc. SystemVerilog package files 406, including the SV nettype and resolution function definitions may be received as an input as well. In some embodiments, the process may compile 408 the text HDL code in the testbench, RTL design, and SV package into a database. The process may then elaborate 410 the design hierarchy and generate the compiled code for simulation. The process may collect 412 the SV-UDN/nettype and UDR definition information in order to create a mapping between a nettype and compatible UDRs. A database 414 is provided that includes the mapping between SV-UDN nettype and multiple UDRs. These may be switched based on user needs at runtime. The user may provide run-time commands using an interactive TCL command 416 or through VPI routines 418. The compiled code may be loaded to simulate 420 the design behavior, and provide an interactive console to obtain run-time input from the user.

Figure 5:
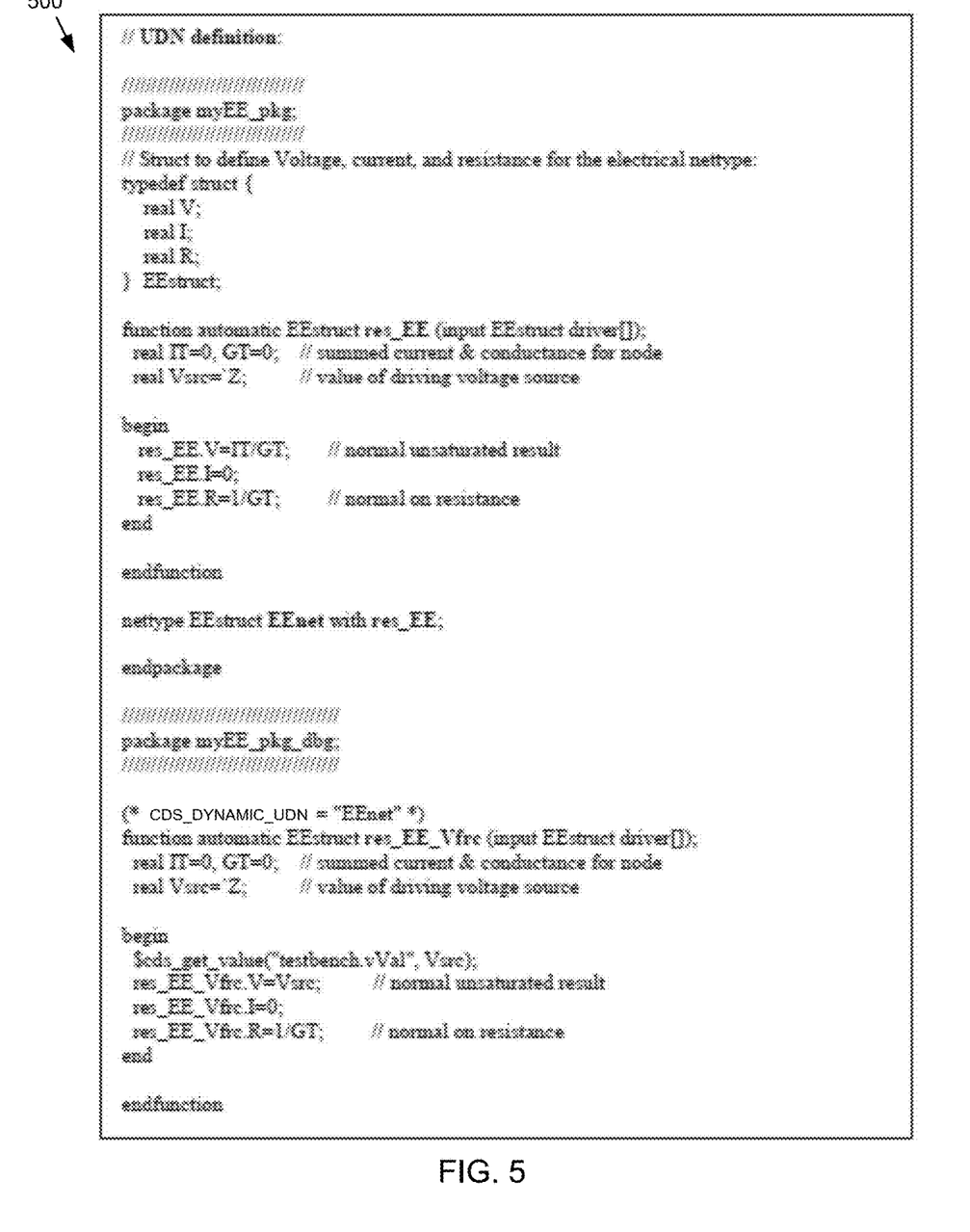
FIG. 5 is an example showing a UDN definition in accordance with an embodiment the present disclosure.

In some embodiments, and referring now to FIG. 5, the present disclosure may allow for the simulation of a 'force/release' value on particular field of SV-UDN. The field may refer to a specific field/element/member of a datatype which is used to create the SV-UDN. For example, a user may define an 'EEstruct' datatype which is then used to create a SV-UDN called say 'EENet':

typedef struct {
real V;
real I;
real R;
} EEstruct;
function automatic EEstruct res_EE (input EEstruct driver[ ]);
... <function definition code> ...
//SV-UDN declaration
nettype EENet EEstruct with res_EE;

In this example, the field/members of the SV-UDN are defined in the datatype EEstruct, for example, 'V'/'I'/'R'. They are 3 particular fields of struct 'EEstruct' which is used to create a SV-UDN called EENet.

The above described mechanism can further be leveraged by the user to simulate the behavior where the user may need to apply the force/release value on a particular field of SV-UDN, which is not supported in the existing SV standard.

In the example of FIG. 5, an SV-UDT 'EE_net' is defined in package 'myEE_pkg' to describe electrical signal. The resolution 'res_EE' will be used to resolve value of SV-UDN by default. Here, there is another resolution function 'res_EE_Vfrc' defined in a separate package 'myEE_pkg_dbg', and associated with SV-UDN 'EE_net'. In this additional resolution function, a predefined VPI task '$cds_get_value( )' is used, to copy a value from the net of testbench 'testbench.vVal' to local variable 'Vsrc'. A value of local variable 'Vsrc' will be applied on the voltage field of SV-UDN.

In this example, during simulation, the default resolution function 'res_EE' will be used automatically, and the voltage field of SV-UDN will be calculated based on current and conductance of the node. A customer or end user could use the SV-UDR updating mechanism to apply a forced voltage value on particular SV-UDN, by updating the resolution function to 'res_EE_Vfrc' on particular net, and putting the forced value on the variable of testbench 'testbench.vVal'. In this way, the simulator will call the resolution function 'res_EE_Vfrc' to resolve the net value, and applying the forced voltage value from testbench 'testbench.vVal' to the voltage field of SV-UDN.

Referring now to FIGS. 6-9, embodiments of the present disclosure depicting static and dynamic approaches are provided. As used herein, the static approach may refer to configuring one or more UDRs at elaboration time using specific attributes in the netlist, As such, they may be updated, on-demand, at runtime to simulate dynamic SV-UDN behavior. The dynamic approach refers to the process of configuring UDRs without any additional information in the netlist. This may include multiple variations. For example, set up approach 'A' which may collect related information at elaboration time proactively or set up approach 'B' which may occur entirely at run-time, where the set up may also be initiated at run-time prior to the dynamic, on-demand updating of UDRs at run-time, to simulate dynamic SV-UDN behavior.

Figure 6:
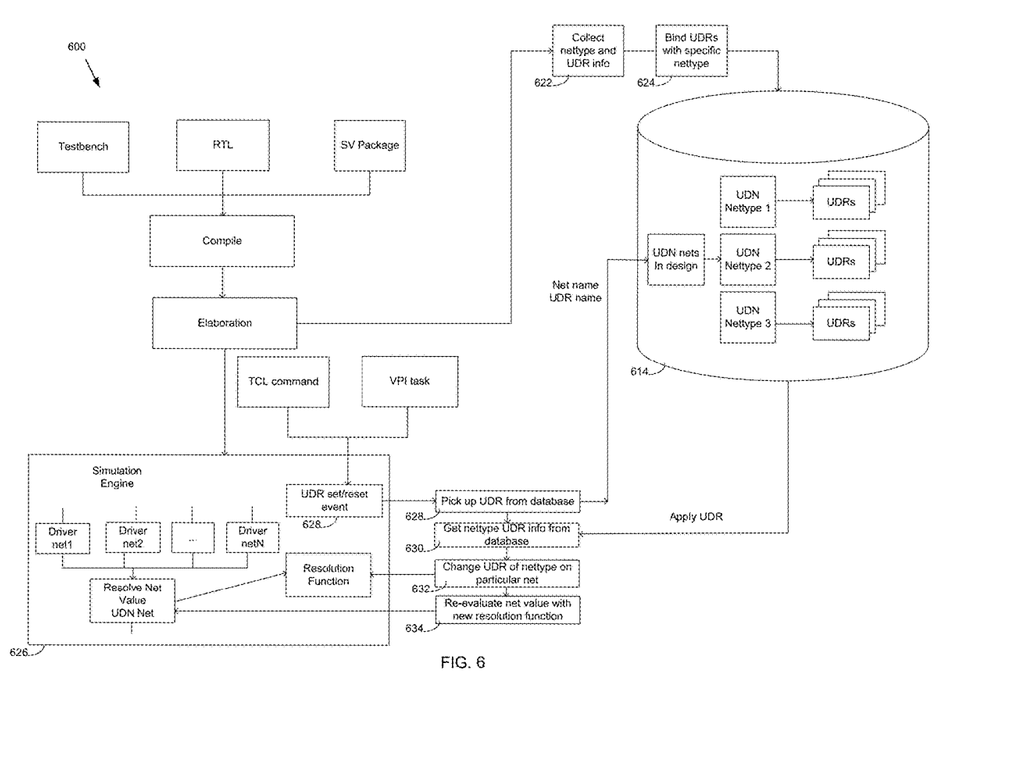
FIG. 6 is a diagram showing an example of static UDR collection processing consistent with an embodiment of the present disclosure.
Figure 7:
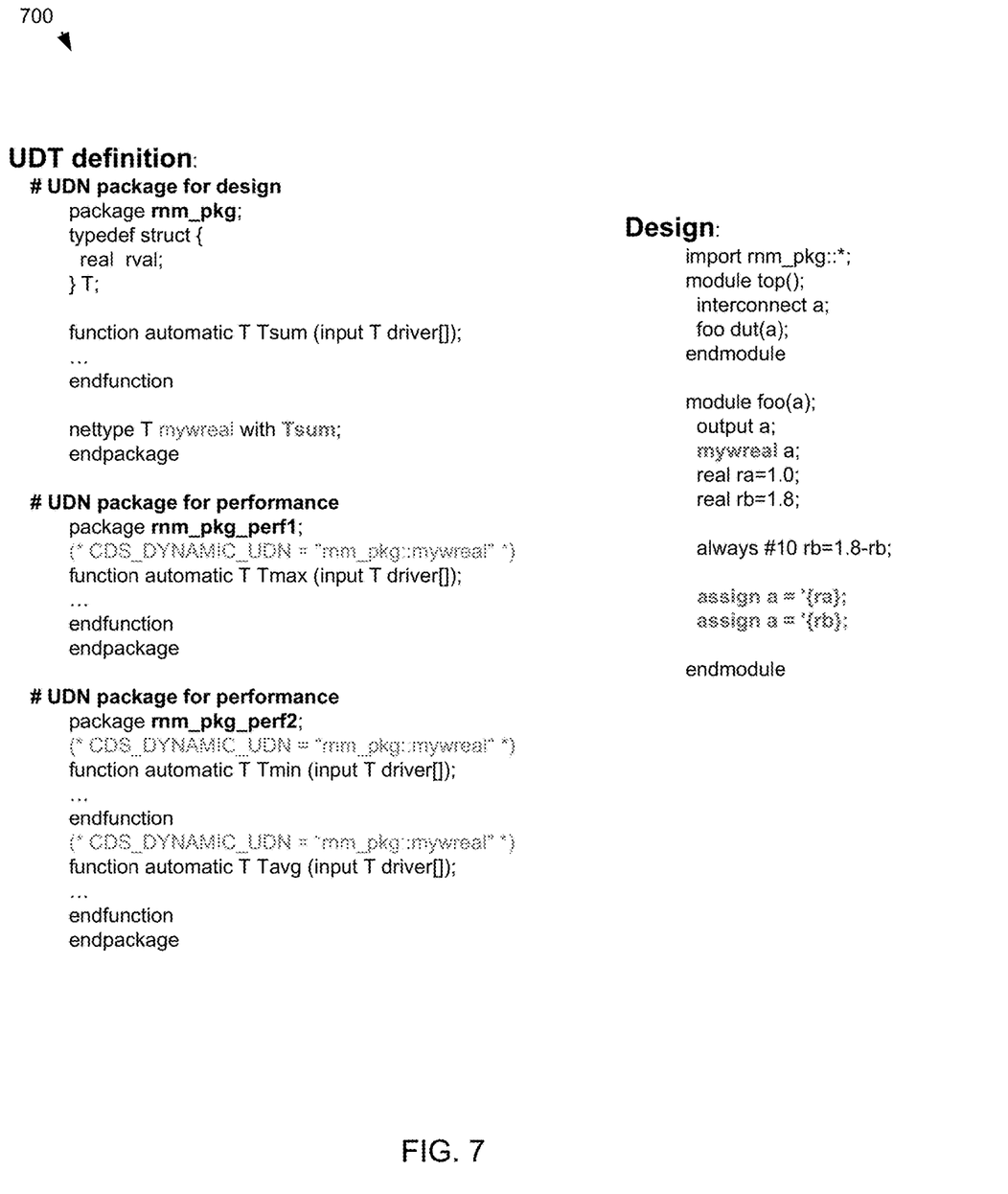
FIG. 7 is an example showing a UDT definition for a static approach in accordance with an embodiment the present disclosure.

FIGS. 6-7 depict a static approach of configuring UDRs at elaboration time using specific attributes in the netlist. FIG. 6 shows a flowchart 600 and FIG. 7 shows the related netlists/HDL code. In this way, they may be updated on-demand at runtime to simulate dynamic SV-UDN behavior.

In some embodiments FIG. 6 displays many of the same elements as shown in FIG. 4. FIG. 6 also may be configured to collect 622 the nettype and UDR information 622, which may include reading the user attribute 'CDS_DYNAMIC_UDN' specified in the SV package. The process may then bind 624 UDRs with specific nettypes. This may involve creating a map from SV-UDN/nettype to multiple UDRs and storing this map in database 614 for a run-time query. The database of a mapping between SV-UDN nettype and multiple UDRs may be switched based on user needs at runtime.

In some embodiments, a simulation engine 626 may be configured to load the compiled code to simulate the design behavior and to provide an interactive console to obtain run-time input from the user. The simulation engine may perform processing 628 based on the user's input and process it in simulation. The process may obtain 630 the net name and UDR name from the UDR set-reset input command. The process may then determine 632 the specified (and valid) resolution function processing from the database. The process may then replace 634 the resolution function processing and re-evaluate 636 the net value with the new resolution function processing. The resolved net value may then be updated.

Referring also to FIG. 7, an example consistent with embodiments of the present disclosure is provided. FIG. 7 shows a net type definition where the UDN 'mywreal' is defined with resolution function 'Tsum', in design package. Additionally, there are 3 resolution functions—say 'Tmax', 'Tmin', and 'Tavg' defined in separate packages for on demand use during simulation. These 3 resolution functions are associated with UDN 'mywreal' through attribute 'CDS_DYNAMIC_UDN'. With regard to the design description, the net 'top.dut.a' of 'mywreal' UDN/nettype has 2 drivers: 'ra' and 'rb'. It should be noted that a typical design could have many such UDNs.

In this example, an SV-UDN 'mywreal' is defined in package 'rnm_pkg'. The user defined resolution 'Tsum' will be used to resolve value of SV-UDN. Further, in this example, there are three other SV-UDRs 'Tmax', 'Tmin' and 'Tavg' which are defined in a separate package 'rnm_pkg_dbg'. Based on the above specification, these three additional SV-UDRs also qualify to be associated with SV-UDN 'mywreal' at simulation time. In that example, the SV-UDR 'Tsum' will be used as default resolution while the other three SV-UDRs may be used for updating UDRs dynamically, if necessary, during simulation, thereby simulating the concept of a 'dynamic' SV user-defined nettype from a user perspective.

In some embodiments, during elaboration, and once the additional package is included, embodiments of the present disclosure may be configured to compile these additional three SV-UDRs into the electronic design. The process may create appropriate data structures in a database to process these additional SV-UDRs and set them up for changing, on demand, during a simulation.

Figure 8:
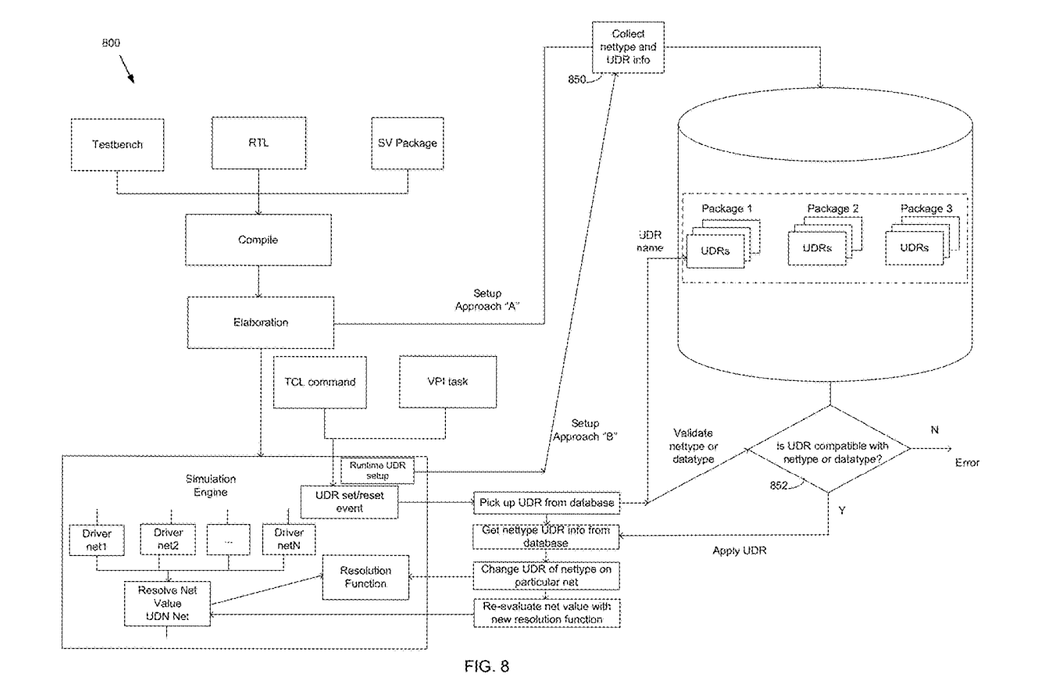
FIG. 8 is a diagram showing an example of dynamic UDR collection processing consistent with an embodiment of the present disclosure.
Figure 9:
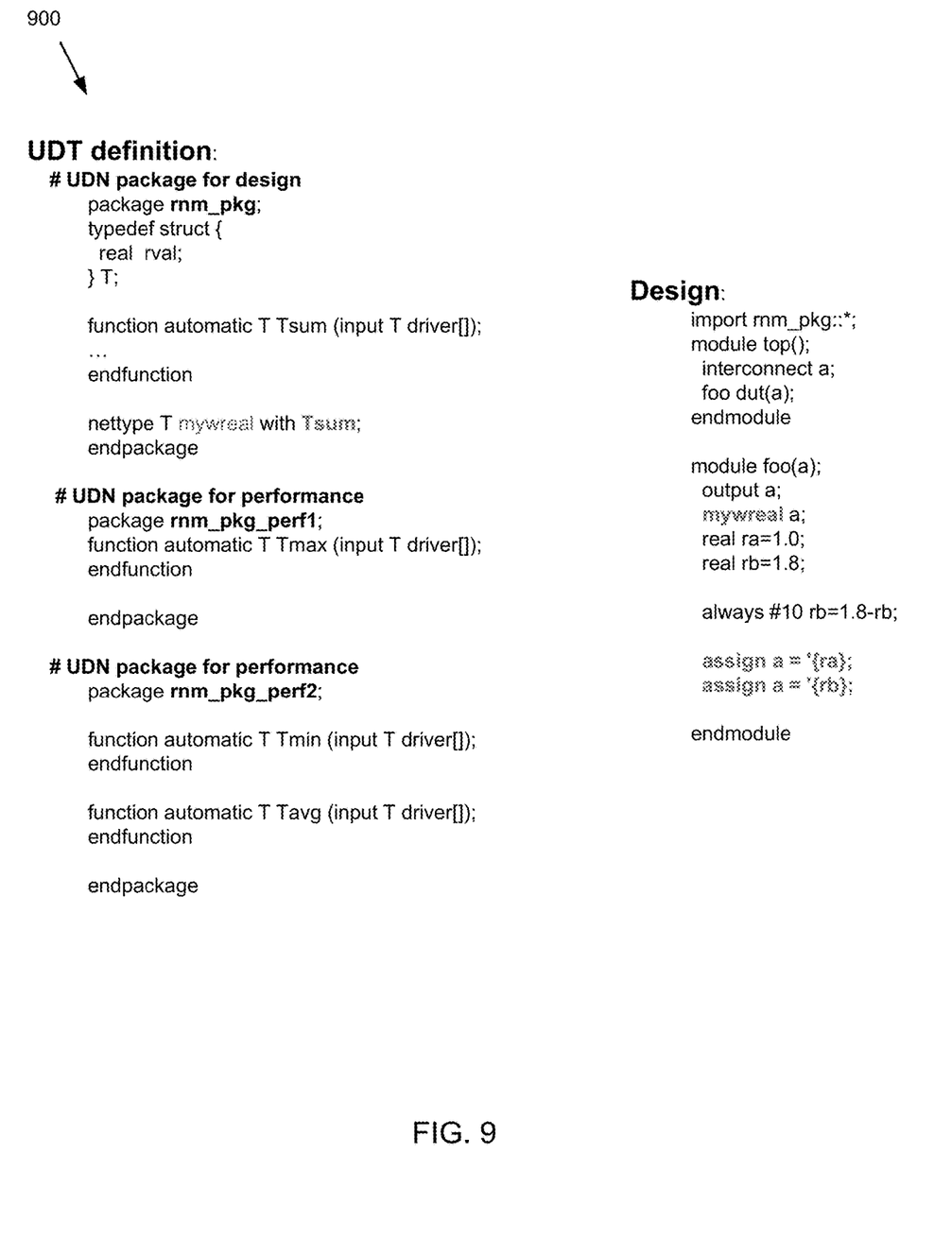
FIG. 9 is an example showing a UDT definition for a dynamic approach in accordance with an embodiment the present disclosure.

FIGS. 8-9 depict a dynamic approach of configuring UDRs without any additional info in the netlist. FIG. 8 shows a flowchart 800 and FIG. 9 shows the related netlists/HDL code. These approaches may include numerous variations. For example, set up approach 'A' may collect related information at elaboration time proactively. In contrast, set up approach 'B' may occur entirely at run-time—where the setup is also initiated at run-time prior to the dynamic, on-demand updating of UDRs at run-time—to simulate 'dynamic' SV-UDN behavior. In this particular example, the system may collect 850 UDR information. This may include walking through the nettype and resolution function definitions and matching the nettype with compatible resolution automatically. This may occur during elaboration in approach 'A', or during simulation in approach 'B'. If the UDR is incompatible with the nettype, the system may report 852 the error.

In some embodiments, FIG. 9 shows a net type definition where the UDN 'mywreal' is defined with resolution function 'Tsum', in design package. Additionally, there are 3 resolution functions 'Tmax', 'Tmin', and 'Tavg' defined in separate packages for 'on demand' use during simulation. It should be noted that these three resolution functions require no explicit association in HDL. Rules will applied at runtime to check compatibility of datatype or nettype for a given UDR. With regard to the design description, the net 'top.dut.a' has 2 drivers: 'ra' and 'rb'. It should be noted that a typical design could have many such UDNs.

Figure 10:
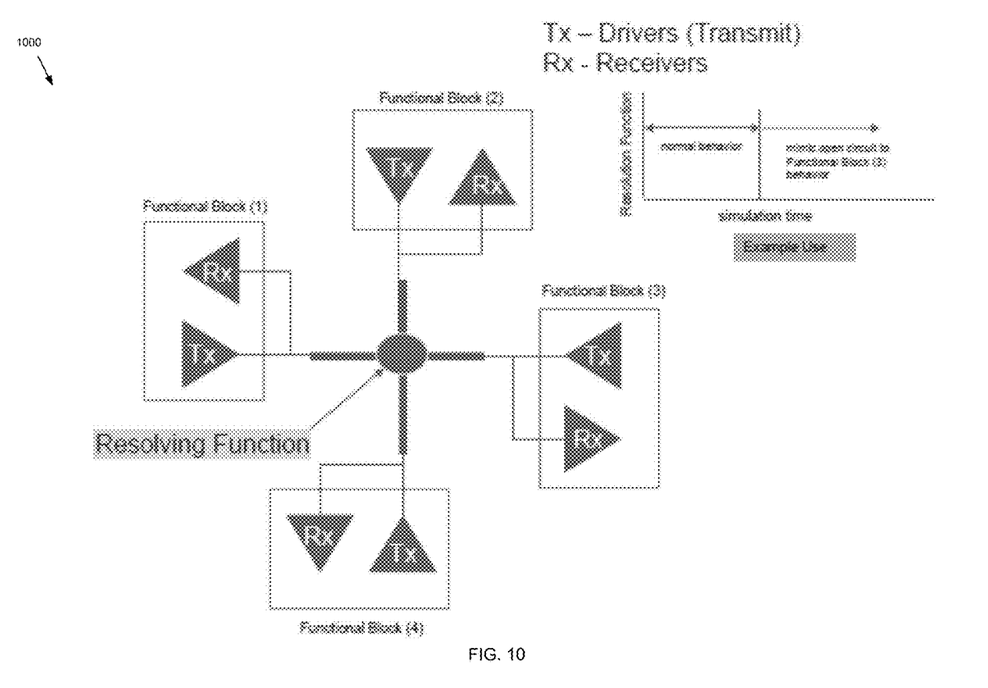
FIG. 10 is a diagram showing an example resolving function consistent with an embodiment of the present disclosure.

Referring now to FIG. 10, an example diagram showing an example of a resolving function is provided. Embodiments included herein may be used to dynamically change the resolutions of multiple drivers in real number modeling (simulation). A resolving function that resolves the Tx (transmitter) drive values (and therefore what the Rx (receivers) observe) can be changed dynamically during simulation to mimic the effect of various parameters. Some of these may include, but are not limited to, temperature changes, connectivity aging, opens (on one or several connections), electro migration, Rx/Tx channel noise modeling, circuit loading in the context of simulating system behavior for functional safety, process reliability, device longevity, and/or telecom channels (LTE Technology), etc.

Accordingly, embodiments of the present disclosure may allow users to easily update an SV-UDR dynamically during simulation. With this capability, the user may change the SV-UDR on a particular signal to address their verification requirements at run-time. The additional UDRs could be defined in a separate SV package, instead of changing the existing design. In this way, the user could compile multiple UDRs in one elaboration and select any one of those across packages at different timepoints of a simulation. This provides high performance mixed signal verification, including, but not limited to, RNM and AMS simulations with SPICE, Verilog-AMS, etc.

In existing approaches, in order to use different resolution functions for various purposes, the user may need to modify the definition of an SV-UDN, then recompile the design and then rerun the full simulation. Further, if the user has a need to debug a specific net, the debug version of the SV-UDR cannot be specified for that particular net of user defined nettype (SV-UDN) without modifying the SV-UDN declaration which impacts all instances of that nettype. Using debug version SV-UDR on an SV-UDN of entire design will introduce a negative impact on the simulation performance. As such, the user is often challenged to manage SV-UDN declarations to cater to his or her performance and accuracy needs. Or create more elaborate resolution functions with various conditions to control specific code segments within SV-UDR while controlling them via techniques like $test$plusargs—which can slow down sims, complicate code intent and difficult to maintain as well. Aspect Oriented Programming (AOP) concepts could be mimicked to a certain extent by using virtual classes and functions in SystemVerilog but those concepts only apply to the 'variable' type of objects in SV. The requirement where users are to be able to change SV-UDR of a specific net, dynamically during simulation, to address specific verification needs of speed vs accuracy of design—is therefore not clearly addressed so far. Accordingly, embodiments included herein define the concept of a 'dynamic SV-UDN/nettype' for high performance mixed signal verification.

In some embodiments, with this capability, a user may change the SV-UDR on a particular signal to address their verification requirements at run-time. The additional UDRs may be defined in a separate SV package, instead of changing the existing design. In this way, the user could compile multiple UDRs in one elaboration and select any one of those across packages at different timepoints of a simulation. This provides high performance mixed signal verification for a variety of simulations, some of which may include, but are not limited to, RNM and AMS simulations with SPICE, Verilog-AMS, etc.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method comprising:
    receiving, using a processor, an electronic circuit design;
    compiling and elaborating the electronic circuit design;
    simulating the electronic circuit design;
    updating, during the simulating, a System Verilog User-Defined Resolution function ("SV-UDR") associated with the electronic circuit design; and
    allowing a user to select one of the plurality of SV-UDRs at a first timepoint during the simulating and to select a second of the plurality of SV-UDRs at a second timepoint during the simulating.

2. The computer-implemented method of claim 1, wherein updating is specified using a command.

3. The computer-implemented method of claim 2, wherein the command is a tool command language ("TCL") command.

4. The computer-implemented method of claim 1, wherein updating is specified using a task.

5. The computer-implemented method of claim 4, wherein the task is a Verilog Procedural Interface ("VPI") task.

6. The computer-implemented method of claim 1, further comprising:
    defining a plurality of SV-UDRs in a distinct System Verilog ("SV") package.

7. The computer-implemented method of claim 6, wherein compiling includes compiling the plurality of SV-UDRs during the elaborating.

8. The computer-implemented method of claim 1, wherein the electronic circuit design is in at least one of a Simulation Program with Integrated Circuit Emphasis ("SPICE") language, a Verilog-AMS language, or a VHDL-AMS language.

9. A system comprising:
    a computing device having at least one processor configured to receive, compile, and elaborate an electronic circuit design, the at least one processor further configured to simulate the electronic circuit design and update, during the simulation, a System Verilog User-Defined Resolution function ("SV-UDR") associated with the electronic circuit design, wherein the at least one processor is further configured to compile a plurality of SV-UDRs in a single elaboration, wherein the at least one processor is further configured to allow a user to select one of the plurality of SV-UDRs at a first timepoint during the simulating and to select a second of the plurality of SV-UDRs at a second timepoint during the simulating.

10. The system of claim 9, wherein the at least one processor is further configured to access the plurality of SV-UDRs from a SystemVerilog package that is separate from the electronic circuit design.

11. The system of claim 9, wherein the at least one processor is further configured to model analog behavior associated with the electronic circuit design using a SystemVerilog Real Number Mode (SV-RNM).

12. The system of claim 9, wherein the at least one processor is further configured to specify the update using a command.

13. The system of claim 9, wherein the at least one processor is further configured to specify the update using a task.

14. A non-transitory computer-readable storage medium, the computer-readable storage medium having stored thereon instructions that when executed by a machine result in one or more operations, the operations comprising:
    receiving, using a processor, an electronic circuit design;
    compiling and elaborating the electronic circuit design;
    simulating the electronic circuit design;
    updating, during the simulating, a System Verilog User-Defined Resolution function ("SV-UDR") associated with the electronic circuit design using at least one of a command or a task; and
    allowing a user to select one of the plurality of SV-UDRs at a first timepoint during the simulating and to select a second of the plurality of SV-UDRs at a second timepoint during the simulating.

15. The computer-readable storage medium of claim 14, further comprising:
    defining a plurality of SV-UDRs in a distinct System Verilog ("SV") package separate from the electronic circuit design.

16. The computer-readable storage medium of claim 15, wherein compiling includes compiling the plurality of SV-UDRs during the elaborating.

17. The computer-readable storage medium of claim 14, further comprising:
    modeling analog behavior associated with the electronic circuit design using a SystemVerilog Real Number Mode (SV-RNM).

* * * * *